(12) United States Patent
Singh et al.

(10) Patent No.: US 7,397,048 B2
(45) Date of Patent: Jul. 8, 2008

(54) TECHNIQUE FOR BORON IMPLANTATION

(75) Inventors: Vikram Singh, North Andover, MA (US); Edmund J. Winder, Waltham, MA (US); Harold M. Persing, Rockport, MA (US); Timothy Jerome Miller, South Hamilton, MA (US); Ziwei Fang, Beverly, MA (US); Atul Gupta, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 525 days.

(21) Appl. No.: 11/227,079

(22) Filed: Sep. 16, 2005

(65) Prior Publication Data

US 2006/0063360 A1 Mar. 23, 2006

Related U.S. Application Data

(60) Provisional application No. 60/611,065, filed on Sep. 17, 2004.

(51) Int. Cl.
*H05H 1/42* (2006.01)

(52) U.S. Cl. .......... 250/492.21; 250/424; 250/425; 250/426; 250/423 R; 438/510; 438/513; 438/514; 438/515; 438/516; 423/289; 423/294; 423/276

(58) Field of Classification Search .......... 250/423 R, 250/424, 425, 426, 492.21; 438/510, 513, 438/514, 515, 516; 423/289, 294, 276
See application file for complete search history.

(56) References Cited

U.S. PATENT DOCUMENTS

| | | | |
|---|---|---|---|
| 4,483,911 A * | 11/1984 | Ogawa et al. .......... 430/65 |
| 4,957,773 A | 9/1990 | Spencer et al. | |
| 5,277,932 A * | 1/1994 | Spencer .......... 427/248.1 |
| 5,468,978 A | 11/1995 | Dowben | |
| 5,658,834 A | 8/1997 | Dowben | |
| 5,977,552 A * | 11/1999 | Foad .......... 250/492.21 |
| 5,993,766 A * | 11/1999 | Tom et al. .......... 423/294 |
| 6,025,611 A | 2/2000 | Dowben | |
| 6,440,786 B1 | 8/2002 | Dowben | |
| 6,479,828 B2 * | 11/2002 | Perel .......... 250/425 |
| 6,600,177 B2 | 7/2003 | Dowben | |
| 6,905,947 B2 * | 6/2005 | Goldberg .......... 438/513 |
| 2002/0045300 A1 | 4/2002 | Dowben | |

(Continued)

OTHER PUBLICATIONS

M.A. Foad, R. Webb, R. Smith, J. Matsuo, A. Al-Bayati, T. Shen-Wang, T. Cullis, Shallow junction formation by decaborane molecular ion implantation, J. Vac. Sci. Technol. B 18 (2000) 445-449.

(Continued)

*Primary Examiner*—Jack I. Berman
*Assistant Examiner*—Michael J Logie

(57) ABSTRACT

A technique for boron implantation is disclosed. In one particular exemplary embodiment, the technique may be realized by an apparatus for boron implantation. The apparatus may comprise a reaction chamber. The apparatus may also comprise a source of pentaborane coupled to the reaction chamber, wherein the source is capable of supplying a substantially pure form of pentaborane into the reaction chamber. The apparatus may further comprise a power supply that is configured to energize the pentaborane in the reaction chamber sufficiently to produce a plasma discharge having boron-bearing ions.

16 Claims, 3 Drawing Sheets

U.S. PATENT DOCUMENTS

2002/0076918 A1    6/2002    Han et al.
2004/0119025 A1*   6/2004    Klepper et al. ............... 250/424
2005/0163693 A1*   7/2005    Spielvogel et al. ........... 423/294
2006/0097193 A1*   5/2006    Horsky et al. .......... 250/492.21

OTHER PUBLICATIONS

K. Goto, J. Matsuo, T. Sugii, H. Minakata, I. Yamada, and T. Hisatsugu: Novel Shallow Junction Technology Using Decaborane (B10 H14). IEDM Tech. Dig., p. 435, 1996.

* cited by examiner

TECHNIQUE FOR BORON IMPLANTATION

CROSS-REFERENCE TO RELATED APPLICATIONS

This patent application claims priority to U.S. Provisional Patent Application No. 60/611,065, filed Sep. 17, 2004, which is hereby incorporated by reference herein in its entirety.

FIELD OF THE DISCLOSURE

The present disclosure relates generally to semiconductor manufacturing and, more particularly, to a technique for boron implantation.

BACKGROUND OF THE DISCLOSURE

Ion implantation is a standard technique for introducing conductivity-altering dopant materials into semiconductor wafers. In a conventional (beam-line type) ion implantation system, a desired dopant material is ionized in an ion source, the ions are accelerated to form an ion beam of a prescribed energy, and the ion beam is directed at a semiconductor wafer. The energetic ions in the beam penetrate into the bulk of the semiconductor material and are embedded into the crystalline lattice of the semiconductor material.

Compared with the traditional beam-line implanters which have low throughputs at low energies, plasma immersion implant technology is very attractive because it offers the potential of very high throughputs at relatively low implant energies. With the plasma immersion implant technology, an active plasma is typically created with an appropriate gas species, from which positive ions are extracted and implanted into a substrate with the application of direct current (DC) or radio frequency (RF) pulses.

For plasma immersion ion implantation to work, it is necessary to select gas species that, when subjected to either pulsed or continuous plasma discharge, produce desired ions. Gas species suitable for plasma immersion ion implantation typically have the following properties: (1) they are easy to store, either as a gas or in a solid or liquid source with a reasonable vapor pressure; (2) they can be handled by standard gas delivery systems; and (3) they are easily ionizable in a plasma. In addition, the ions produced by the plasma should be able to provide desired results for the specific application targeted, e.g. n-type or p-type implants, gate oxide nitridation, contact resistance reduction, hardening etc.

It is also desirable to prevent unwanted ions from co-implanting into the target wafer. For the specific application of p-type doping where fluorine atoms must be avoided, diborane ($B_2H_6$) is a commonly used gas species. Due to safety and stability problems, diborane cannot be provided in its pure state. Rather, diborane is typically diluted in helium or hydrogen. When such diluted diborane is used for plasma immersion ion implantation, the carrier (diluent) gas molecules can become ionized and get implanted in addition to the boron-bearing species, thereby adversely impacting the process by complicating dosimetry, introducing unwanted contaminants, and imposing process space limitations on the implant process.

Use of higher boranes such as octaborane and decaborane has been proposed and implemented in beam-line ion implantation systems. For these systems, the main advantage of higher boranes is the ability to achieve a specific implant depth with a relatively high beam energy. This is considered useful because beam-line implanters have higher beam currents (and therefore higher throughputs) at higher energies than they do at lower energies.

In view of the foregoing, it would be desirable to provide a solution for ion implantation which overcomes the above-described inadequacies and shortcomings.

SUMMARY OF THE DISCLOSURE

A technique for boron implantation is disclosed. In one particular exemplary embodiment, the technique may be realized by an apparatus for boron implantation. The apparatus may comprise a reaction chamber. The apparatus may also comprise a source of pentaborane coupled to the reaction chamber, wherein the source is capable of supplying a substantially pure form of pentaborane into the reaction chamber. The apparatus may further comprise a power supply that is configured to energize the pentaborane in the reaction chamber sufficiently to produce a plasma discharge having boron-bearing ions.

In accordance with other aspects of this particular exemplary embodiment, the apparatus may further comprise a substrate platform that holds at least one wafer, wherein the at least one wafer is immersed in the plasma discharge and boron-bearing ions are implanted into the at least one wafer. The apparatus may additionally comprise a source of one or more reducing species, wherein the one or more reducing species are supplied into the reaction chamber to alter a surface chemistry associated with the at least one wafer.

In accordance with further aspects of this particular exemplary embodiment, the apparatus may further comprise an extraction mechanism that extracts the boron-bearing ions from the plasma discharge and supplies the boron-bearing ions to a beam-line ion implanter.

In accordance with additional aspects of this particular exemplary embodiment, the power supply may provide a radio frequency electrical power to the reaction chamber. Alternatively, the power supply may provide a direct current electrical power to the reaction chamber.

In accordance with another aspect of this particular exemplary embodiment, the apparatus may further comprise a source of one or more inert gases, wherein the one or more inert gases are supplied into the reaction chamber to alter a partial pressure associated with the pentaborane.

In accordance with yet another aspect of this particular exemplary embodiment, the apparatus may further comprise a source of one or more oxidizing species, wherein the one or more oxidizing species are supplied into the reaction chamber to modify the plasma discharge.

In another particular exemplary embodiment, the technique may be realized as a method for boron implantation. The method may comprise supplying into a reaction chamber a gas comprising a substantially pure form of pentaborane. The method may also comprise energizing the gas sufficiently to produce a plasma discharge having boron-bearing ions.

In accordance with other aspects of this particular exemplary embodiment, the method may further comprise immersing at least one wafer in the plasma discharge. The method may additionally comprise causing the boron-bearing ions to be implanted into the at least one wafer. The method may further comprise supplying into the reaction chamber one or more reducing species to alter a surface chemistry associated with the at least one wafer.

In accordance with further aspects of this particular exemplary embodiment, the method may further comprise extracting the boron-bearing ions from the plasma discharge. The method may additionally comprise supplying the boron-bearing ions to a beam-line ion implanter.

In accordance with additional aspects of this particular exemplary embodiment, the gas may be energized with a radio frequency electrical power. Alternatively, the gas may be energized with a direct current electrical power.

In accordance with another aspect of this particular exemplary embodiment, the method may comprise supplying into the reaction chamber one or more inert gases to alter a partial pressure associated with the pentaborane.

In accordance with yet another aspect of this particular exemplary embodiment, the method may comprise supplying into the reaction chamber one or more oxidizing species to modify the plasma discharge.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure improve boron implantation by replacing the traditionally used diluted diborane ($B_2H_6$) with undiluted or substantially pure pentaborane ($B_5H_9$). In a plasma immersion ion implantation system or a beam-line ion implanter, a plasma discharge may be produced by energizing a gas containing a substantially pure form of pentaborane. Boron-bearing species generated in the plasma discharge may be implanted into a target wafer.

Use of a pure form of pentaborane offers a number of advantages. For example, unwanted co-implantation of diluent species may be reduced or avoided. In a pentaborane plasma, boron-bearing species of different masses are available for implantation, which allows shallower implants at a given voltage. Further, with pure pentaborane, there is a greater flexibility in process space parameters such as operating pressure, mass flow rate, and/or intentionally-added diluents.

Figure 1:
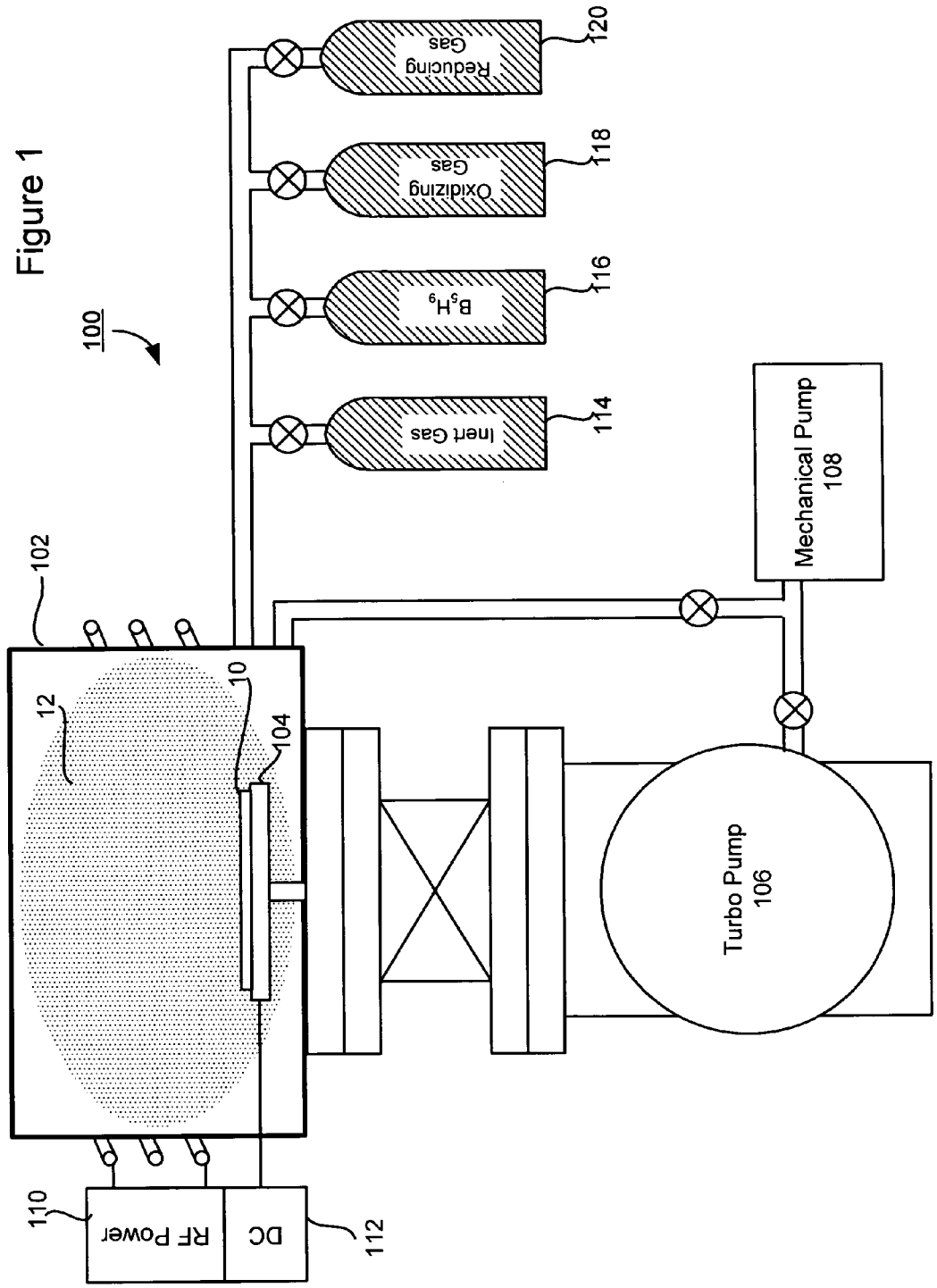
FIG. 1 shows a block diagram illustrating an exemplary system for boron implantation in accordance with an embodiment of the present disclosure.

Referring to FIG. 1, there is shown a block diagram illustrating an exemplary system 100 for boron implantation in accordance with an embodiment of the present disclosure. The system 100 may comprise a reaction chamber 102 inside which a substrate platform 104 may hold a wafer 10. A radio frequency (RF) power supply 110 may be coupled to the reaction chamber 102 to provide RF excitation. A DC power supply 112 may provide a bias voltage (e.g., between 20 V and 20 kV) to the substrate platform 104. A series of vacuum equipment, such as a turbo pump 106 and a mechanical pump 108, may be coupled to the reaction chamber 102. The system 100 may further comprise one or more gas sources, such as an inert gas source 114, a pentaborane source 116, an oxidizing species source 118, and a reducing species source 120. The oxidizing species source 118 may provide, for example, fluorine, chlorine, or oxygen gases. The reducing species source 120 may provide, for example, ammonia or hydrogen. These gas sources may be connected to the reaction chamber 102 via a gas delivery system having gas pipelines, valves and meters.

Pure pentaborane is typically a liquid with a vapor pressure of approximately 200 Torr at room temperature. It may be provided in a container suitable for connection to a typical gas delivery system used in semiconductor manufacturing equipment, such as the Advanced Technology Materials, Inc., (ATMI) VAC canister currently used in the semiconductor industry.

In operation, the reaction chamber 102 may be pumped down to a desired base vacuum level (e.g., $10^{-6}$-$10^{-7}$ Torr) with the mechanical pump 108 and the turbo pump 106. Then, a predetermined amount of pentaborane may be flowed into the reaction chamber 102. The flow rate of pure pentaborane may be in the range of 10-1000 sccm, and the pressure inside the reaction chamber 102 may be maintained in the range of 0.5-1000 mTorr. Upon stabilization of the gas pressure, the RF power supply 110 may be turned on to produce a plasma discharge 12. The RF power may be in the range of 300-3000 watts. A number of boron-bearing ions $B_xH_y$ may be generated in the plasma discharge 12, wherein x is an integer typically in the range of 1 to 5 and y is an integer typically in the range of 1 to 9. These boron-bearing ions typically have heavier masses than that of diborane. The wafer 10 may be at least in part immersed in the plasma discharge 12 and may be bombarded by the boron-bearing ions. The DC bias on the substrate platform 104 may increase ion flux into the wafer 10. The plasma discharge 12 may be sustained for a period of time to achieve a desired dose of boron implantation for the wafer 10. When the ion implantation is completed, the pentaborane source 116 may be switched off, and the inert gas source 114 may be turned on to purge the system 100.

It should be noted that, although only RF plasma is described in connection with FIG. 1, other types of excitation methods may also be used to produce a plasma discharge from pentaborane or its mixture with other gases. For example, inductively coupled plasma, capacitively coupled plasma, and pulsed- or continuous-wave RF plasma may all be suitable to generate a pentaborane plasma. According to embodiments of the present disclosure, a relatively pure source of pentaborane may be used in various plasma doping processes with existing tool platforms without significant modifications thereto.

According to other embodiments, additional gas species can be selectively introduced as "diluents" of the pentaborane for various purposes. For example, inert gases, such as helium, xenon, and argon, may be used to facilitate independent tuning of process parameters (e.g., decreasing the pentaborane partial pressure while keeping reactor residence lime constant). Such tuning of process parameters may control boron implant depth, the degree of film deposition on the wafer, and the etching of the wafer. Oxidizing or reducing species may be provided from their respective sources 118 and 120, and may include oxygen, hydrogen and/or ammonia. These gases may be introduced to alter the plasma chemistry and/or the surface chemistry of the process, providing for control of surface deposition of boron.

Alternatively, an undiluted source of pentaborane may be used in an ion source of a beam-line ion implanter to provide boron ions that can be extracted and then implanted into a wafer. The efficiency of boron generation in such an ion source is notably higher due to the pure nature of the pentaborane supply.

Figure 2:
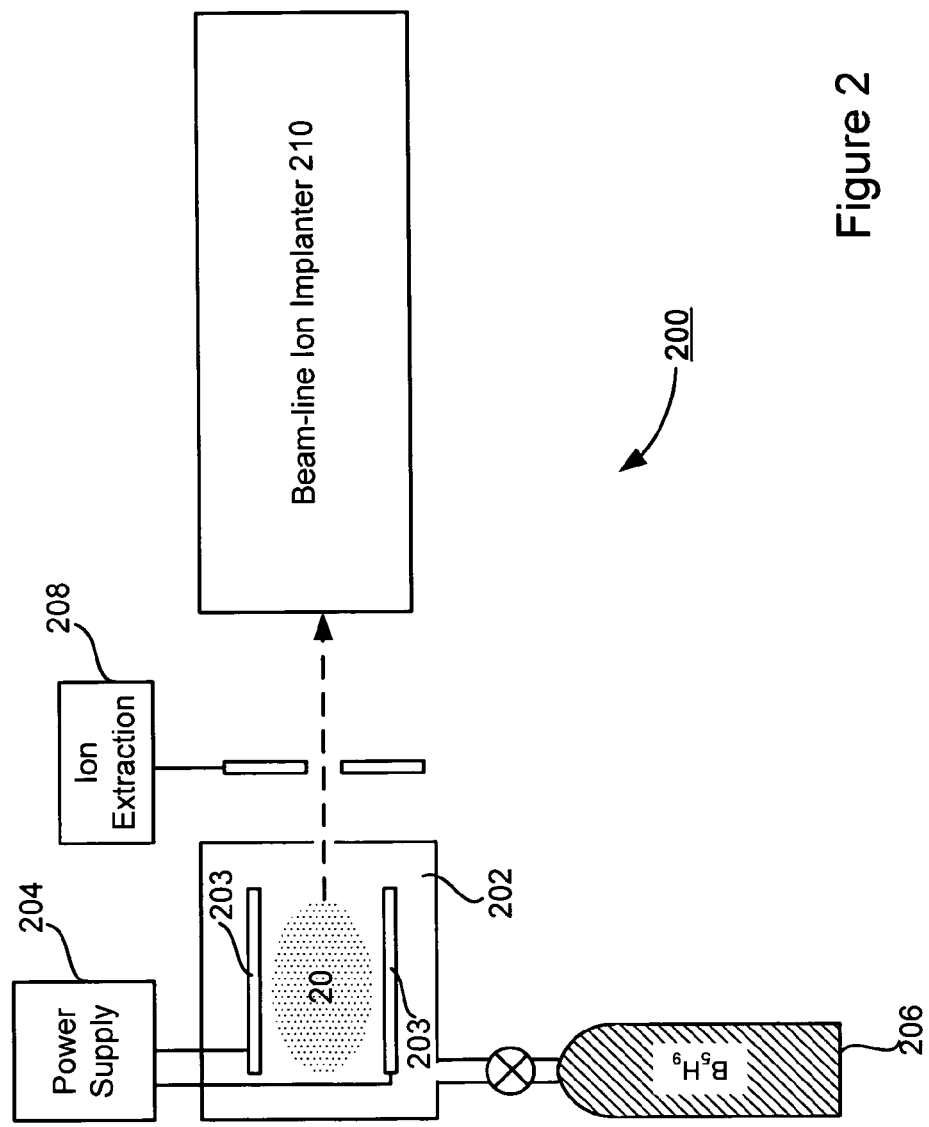
FIG. 2 shows a block diagram illustrating another exemplary system for boron implantation in accordance with an embodiment of the present disclosure.

FIG. 2 shows a block diagram illustrating an exemplary system 200 for boron implantation in accordance with an embodiment of the present disclosure. The system 200 may comprise a reaction chamber 202 to which a power supply 204 and a pentaborane source 206 are coupled. The power supply 204 may be configured to provide RF or DC power to electrodes 203 located on or inside the reaction chamber 202. The pentaborane source 206 may supply pure pentaborane or its mixture with other gases into the reaction chamber 202. The RF or DC power from the power supply 204 may excite the pure pentaborane or its gaseous mixture sufficiently to produce a plasma discharge 20, generating boron ions and/or other boron-bearing ions. These ions may be extracted with an ion extraction device 208 (e.g., a set of biased electrodes) and supplied to a beam-line ion implanter 210. A differential pumping technique may ensure that the vacuum level inside the reaction chamber 202 does not affect that of the beam-line ion implanter 210.

Figure 3:
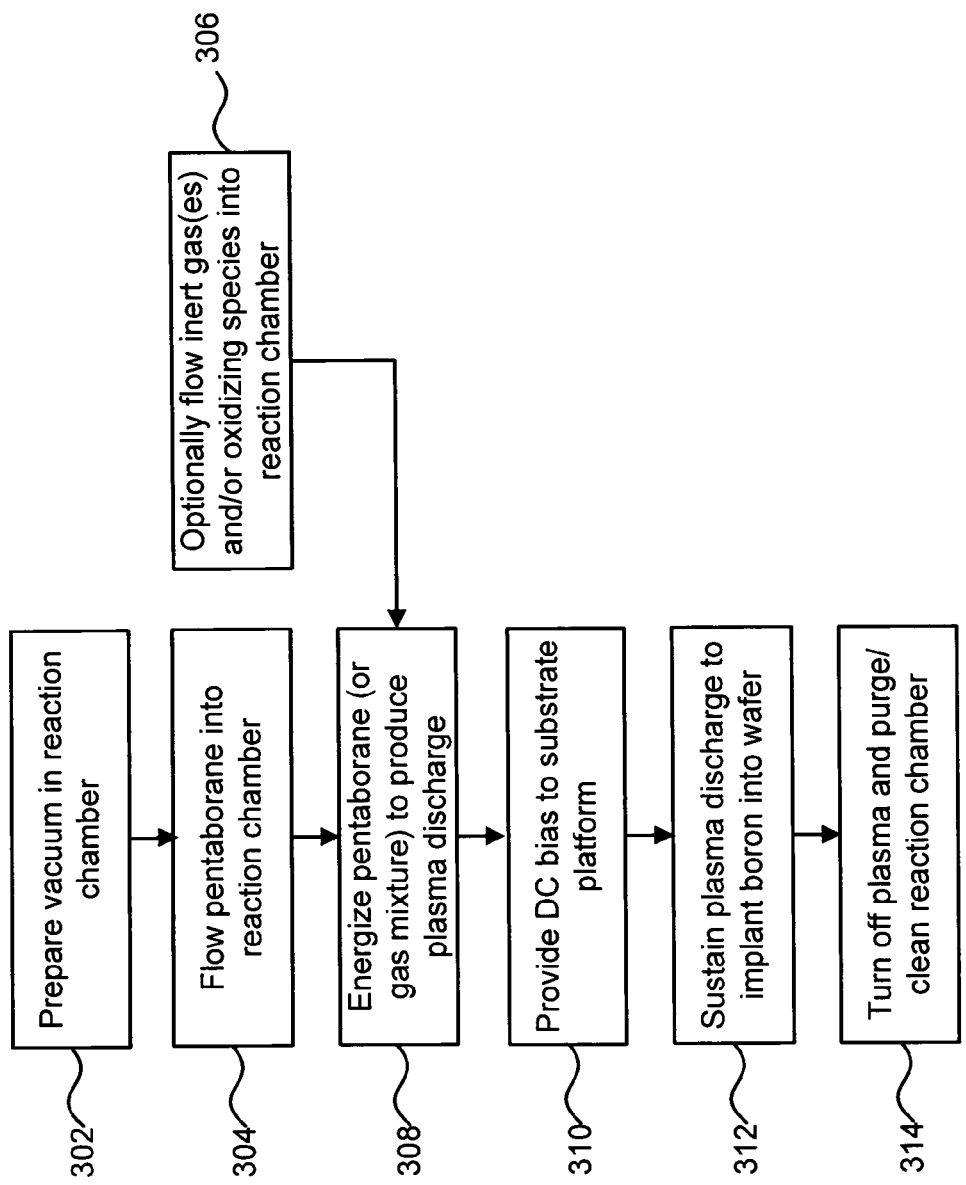
FIG. 3 shows a flow chart illustrating an exemplary method for boron implantation in accordance with an embodiment of the present disclosure.

Referring to FIG. 3, there is shown a flow chart illustrating an exemplary method for boron implantation in accordance with an embodiment of the present disclosure.

In step 302, a reaction chamber may be pumped to a desired vacuum level. The reaction chamber may contain a substrate platform that holds one or more wafers to receive boron dopants.

In step 304, a substantially pure form of pentaborane may be flowed into the reaction chamber. The pentaborane may be undiluted or otherwise relatively free of unwanted gas species. The pentaborane may be stored in a pressurized bottle in a liquid state and may be released into the reaction chamber in a gaseous state. Optionally, in step 306, other gas species such as inert gases, oxidizing or reducing gases may be flowed into the reaction chamber.

In step 308, the pentaborane gas or its mixture with other gases may be energized in the reaction chamber sufficiently to produce a plasma discharge. The plasma discharge may generate boron ions and a number of boron-bearing species which may become either implanted into or deposited onto the one or more wafers. The plasma discharge may completely or partially immerse the one or more wafers or may be in their vicinity.

In step 310, a DC bias may be provided to the substrate platform so that the one or more wafers thereon are at an advantageous voltage potential to attract ions.

In step 312, the plasma discharge is sustained for a period of a few seconds to a few minutes to allow the boron ions or boron-bearing species to be implanted into the one or more wafers.

In step 314, the plasma may be turned off and the reaction chamber may be purged with inert gases. Alternatively, reaction byproducts generated in the pentaborane plasma may be cleaned off the reaction chamber with an oxygen plasma.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for boron implantation comprising:
   a reaction chamber;
   a source of pentaborane coupled to the reaction chamber, wherein the source is capable of supplying a substantially pure form of pentaborane into the reaction chamber; and
   a power supply that is configured to energize the pentaborane in the reaction chamber sufficiently to produce a plasma discharge having boron-bearing ions.

2. The apparatus according to claim 1 further comprising a substrate platform that holds at least one wafer, wherein the at least one wafer is immersed in the plasma discharge and boron-bearing ions are implanted into the at least one wafer.

3. The apparatus according to claim 2 further comprising a source of one or more reducing species, wherein the one or more reducing species are supplied into the reaction chamber to alter a surface chemistry associated with the at least one wafer.

4. The apparatus according to claim 1 further comprising an extraction mechanism that extracts the boron-bearing ions from the plasma discharge and supplies the boron-bearing ions to a beam-line ion implanter.

5. The apparatus according to claim 1, wherein the power supply provides a radio frequency electrical power to the reaction chamber.

6. The apparatus according to claim 1, wherein the power supply provides a direct current electrical power to the reaction chamber.

7. The apparatus according to claim 1 further comprising a source of one or more inert gases, wherein the one or more inert gases are supplied into the reaction chamber to alter a partial pressure associated with the pentaborane.

8. The apparatus according to claim 1 further comprising a source of one or more oxidizing species, wherein the one or more oxidizing species are supplied into the reaction chamber to modify the plasma discharge.

9. A method for boron implantation comprising the steps of:
   supplying into a reaction chamber a gas comprising a substantially pure form of pentaborane; and
   energizing the gas sufficiently to produce a plasma discharge having boron-bearing ions.

10. The method according to claim 9 further comprising:
    immersing at least one wafer in the plasma discharge; and
    causing the boron-bearing ions to be implanted into the at least one wafer.

11. The method according to claim 10 further comprising:
    supplying into the reaction chamber one or more reducing species to alter a surface chemistry associated with the at least one wafer.

12. The method according to claim 9 further comprising:
    extracting the boron-bearing ions from the plasma discharge; and
    supplying the boron-bearing ions to a beam-line ion implanter.

13. The method according to claim 9, wherein the gas is energized with a radio frequency electrical power.

14. The method according to claim 9, wherein the gas is energized with a direct current electrical power.

15. The method according to claim 9 further comprising:
supplying into the reaction chamber one or more inert gases to alter a partial pressure associated with the pentaborane.

16. The method according to claim 9 further comprising:
supplying into the reaction chamber one or more oxidizing species to modify the plasma discharge.

* * * * *